United States Patent
Pedersen et al.

(10) Patent No.: US 8,732,633 B1
(45) Date of Patent: *May 20, 2014

(54) TUNABLE DESIGN OF AN ETHERNET REGION OF AN INTEGRATED CIRCUIT

(71) Applicants: Soren Pedersen, Petaluma, CA (US); Nad Karim, Palo Alto, CA (US); Rony Kurniawan, Petaluma, CA (US)

(72) Inventors: Soren Pedersen, Petaluma, CA (US); Nad Karim, Palo Alto, CA (US); Rony Kurniawan, Petaluma, CA (US)

(73) Assignee: Tamba Networks, Inc., Petaluma, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/934,219

(22) Filed: Jul. 2, 2013

(51) Int. Cl.
*G06F 9/45* (2006.01)

(52) U.S. Cl.
USPC .......................... 716/103; 716/100; 716/104

(58) Field of Classification Search
USPC .......................................... 716/100, 103, 104
See application file for complete search history.

(56) References Cited

U.S. PATENT DOCUMENTS

| | | | |
|---|---|---|---|
| 6,781,470 B2 | 8/2004 | Rogerson | |
| 7,873,057 B2 | 1/2011 | Robitaille et al. | |
| 7,882,462 B2 | 2/2011 | Ogilvie et al. | |
| 8,107,821 B2 | 1/2012 | El Ahmadi et al. | |
| 8,366,552 B2* | 2/2013 | Perlman et al. | 463/42 |
| 8,443,314 B1 | 5/2013 | El-Zein et al. | |
| 2009/0263129 A1 | 10/2009 | Draer et al. | |
| 2010/0277201 A1* | 11/2010 | Wortman et al. | 326/38 |
| 2012/0030438 A1* | 2/2012 | Shafai et al. | 711/159 |
| 2013/0132643 A1* | 5/2013 | Huang | 711/103 |
| 2013/0135816 A1* | 5/2013 | Huang | 361/679.33 |

* cited by examiner

*Primary Examiner* — Sun Lin
(74) *Attorney, Agent, or Firm* — IP Investment Law Group

(57) ABSTRACT

Disclosed are a method, non-transitory medium, and system of a tunable design of an Ethernet region of an integrated circuit (IC). In one embodiment, a method comprises modeling a design abstraction of an Ethernet sub-circuit of an integrated circuit as a register transfer level (RTL) code within a data processing device, wherein a first stage of sequential logic in the RTL code is associated with a first stage of combinational logic in the RTL code. The method further comprises implementing, through a processor and based on a timing parameter input into a synthesis tool associated with the RTL code, a selective bypass or a selective enablement of the first stage of sequential logic. Still further, the method comprises synthesizing, through the processor, a netlist from the RTL code, wherein the first stage of sequential logic is sequentially bypassed or sequentially enabled.

20 Claims, 9 Drawing Sheets

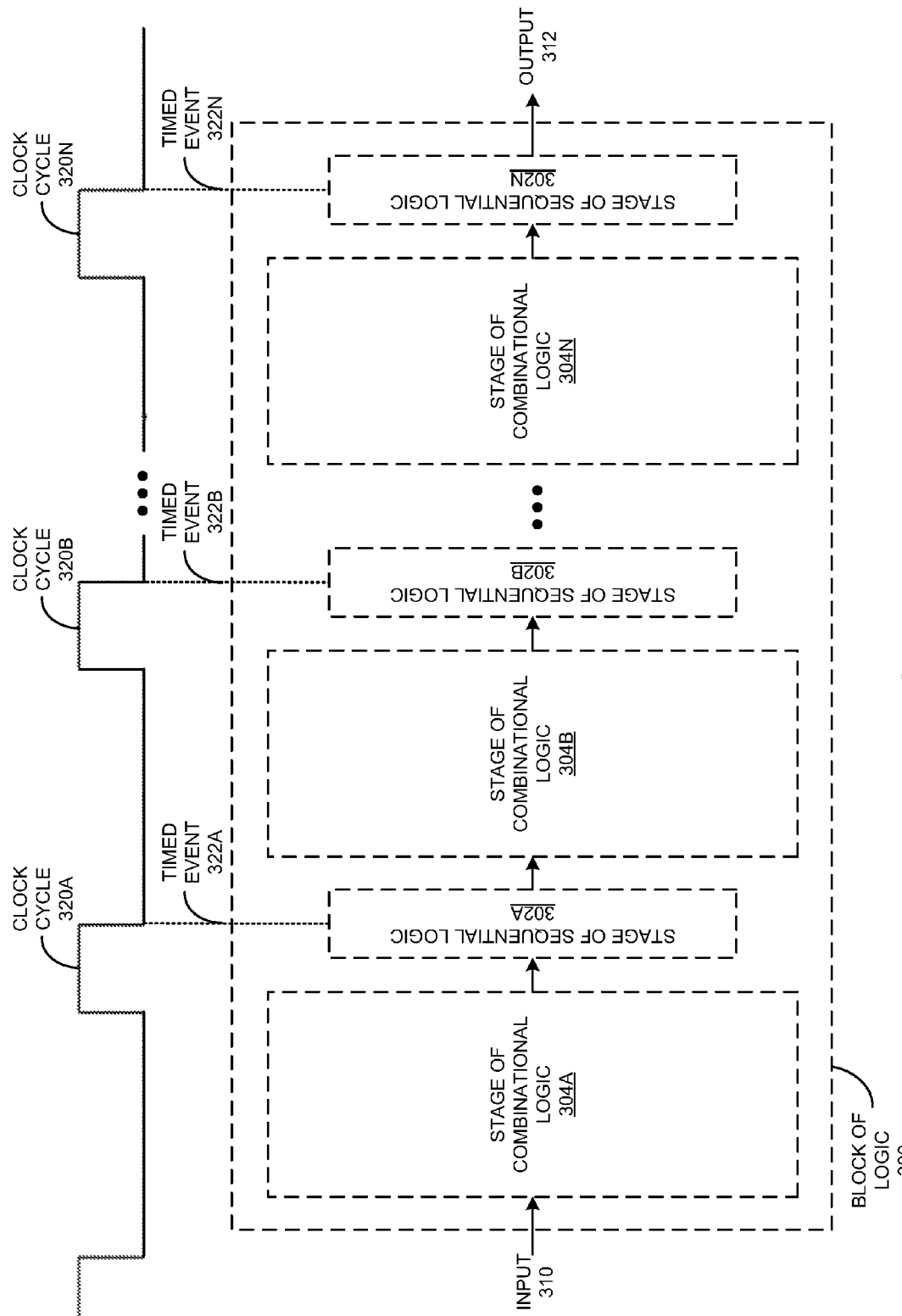

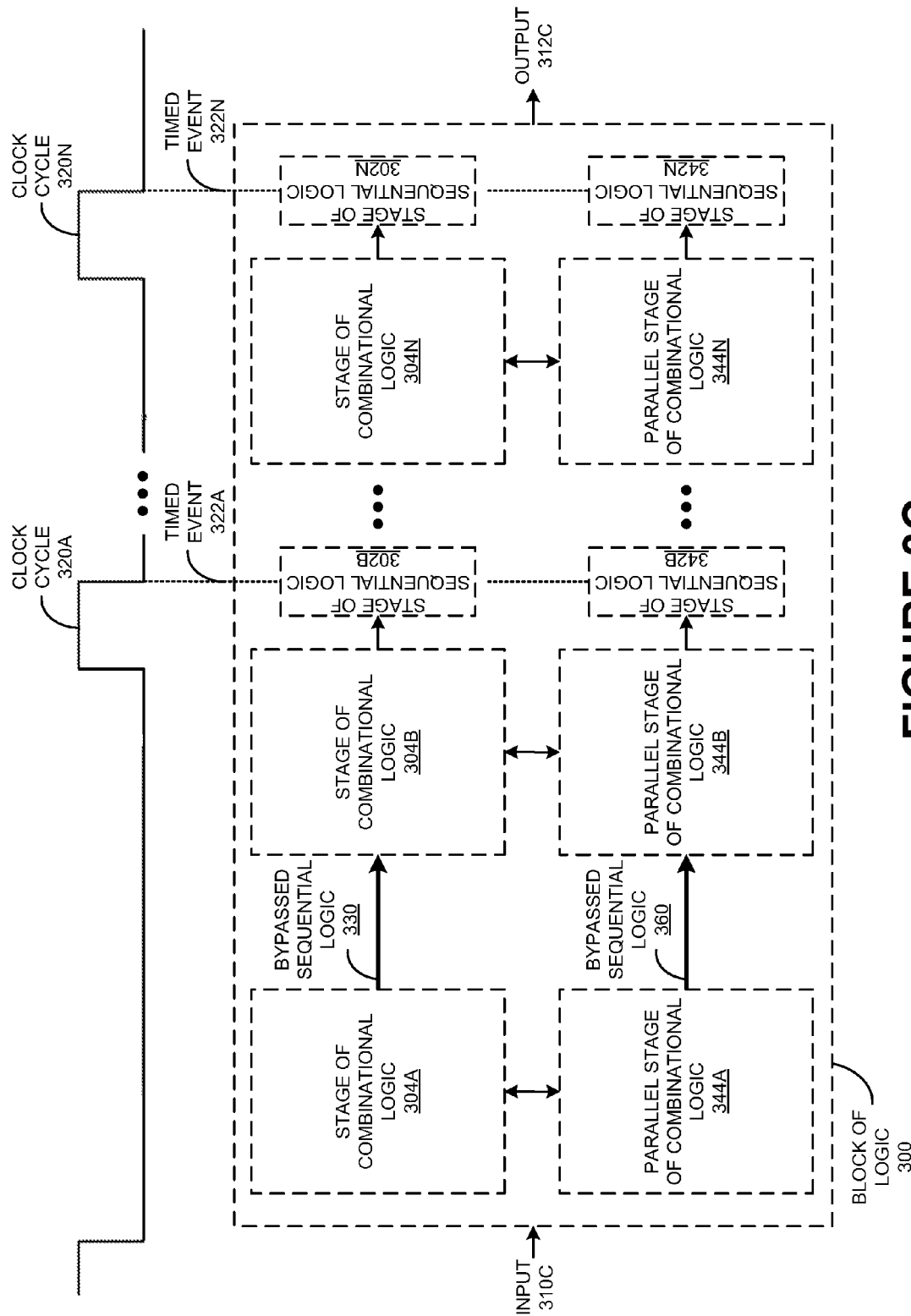

TUNABLE DESIGN OF AN ETHERNET REGION OF AN INTEGRATED CIRCUIT

FIELD OF TECHNOLOGY

This disclosure relates generally to customized high performance Ethernet communication solutions and, more particularly, to a method, non-transitory medium, and/or a system of a tunable design of an Ethernet region of an integrated circuit.

BACKGROUND

A customer may desire timely delivery of a customized Ethernet networking solution that achieves high performance communication. Furthermore, the customer may wish to minimize and/or optimize a latency at the network, data link, and/or physical layers of the open systems interconnection (OSI) abstraction model. For example, the customer may be a high speed internet provider, have a website concerned with webpage loading times and/or video streaming quality, and/or have another application that requires low latency and/or real time response. A vendor may provide the customized Ethernet networking solution to the customer as a design of an Ethernet sub-circuit of an IC that is customized for a technology and/or design requirements desired by the customer. However, the vendor may require significant time and technical expertise to develop the design of the Ethernet sub-circuit.

In one example, the customized Ethernet networking solution may be targeted to a data center involved in high frequency trading, an area where low latency Ethernet communication within and between data centers is critically important. The customer may upgrade to ICs in the data center that use a faster switching technology (for example: a smaller technology node size). The customer may therefore desire a design of a new Ethernet sub-circuit that is latency optimized for the faster switching technology. Alternatively, the customer may redesign the ICs in the data center using the same technology, but may require a design of an Ethernet sub-circuit that can achieve and/or accommodate a new target input and/or output bandwidth, frequency and/or bus width (such as a new bus width input to the Ethernet sub-circuit by the IC). In both cases, the vendor may require a significant amount of time and technical expertise in order to generate a customized design of the new Ethernet sub-circuit that can meet timing requirements while maintaining, optimizing and/or minimizing latency, size and/or power consumption of the Ethernet sub-circuit. As a result, the customer may not have the time or financial resources to invest in the customized Ethernet solution.

SUMMARY

Disclosed are a method, a non-transitory medium, and/or a system of a tunable design of an Ethernet region of an integrated circuit (IC).

In one aspect, a method comprises modeling a design abstraction of an Ethernet sub-circuit of an integrated circuit as a register transfer level (RTL) code within a data processing device, wherein a first stage of sequential logic in the RTL code is associated with a first stage of combinational logic in the RTL code. The method further comprises implementing, through a processor and based on a timing parameter input into a synthesis tool associated with the RTL code, a selective bypass or a selective enablement of the first stage of sequential logic. Still further, the method comprises synthesizing, through the processor, a netlist from the RTL code, wherein the first stage of sequential logic is sequentially bypassed or sequentially enabled. The method may further comprise matching, through the processor, a timing of the first stage of combinational logic and a second stage of combinational logic in the RTL code by the selective bypass or the selective enablement of a second stage of sequential logic in the RTL code associated with the second stage of combinatorial logic.

In one or more embodiments, the method may further comprise implementing, through the processor and based on a scaling parameter input into the synthesis tool associated with the RTL code, the selective bypass or the selective enablement of a third stage of sequential logic in the RTL code and/or a third stage of combinational logic in the RTL code. The predetermined scaling parameter may be a width of a bus, a word count of the bus, and/or a word size of the bus. The bus may be a bus internal to the Ethernet sub-circuit, a bus coupling the Ethernet sub-circuit to the integrated circuit, and a bus coupling the Ethernet sub-circuit to a hardware external to the integrated circuit.

In one or more embodiments, when the scaling parameter is the word size of the bus, the Ethernet sub-circuit may be configured, through the processor, to apply an identical forwarding of each byte in a word and/or each bit in the word. In one or more embodiments, the method comprise determining, through the processor, one of the word count, the word size, and the width of the bus based on the other two of the word count, the word size, and the width of the bus. Further, the method may comprise defining, through the processor, the scaling parameter to be the one of the word count, the word size, and the width of the bus.

In one or more embodiments, the method may further comprise optimizing, through the processor, a latency of the Ethernet sub-circuit processing a data flow when the selective bypass of a stage of sequential logic allows for more combinational logic to be performed in a clock cycle. In addition, the method may comprise optimizing, through the processor, a power consumption of the Ethernet sub-circuit processing the data flow when a stage of combinational logic is selectively bypassed. Additionally, the method may comprise optimizing, through the processor, a physical size of the Ethernet sub-circuit when the stage of combinational logic is selectively bypassed. In one or more embodiments, the timing parameter and/or a scaling parameter may be determined by a program associated with an application programming interface (API) of the RTL code.

In another aspect, a non-transitory medium is readable through a processor and includes instructions embodied therein that are executable through the processor. Further, the non-transitory medium comprises instructions to implement, through the processor and based on a timing parameter input into a synthesis tool associated with a register transfer level (RTL) code, a selective bypass or a selective enablement of a first stage of sequential logic in the RTL code associated with a first stage of combinational logic in the RTL code, wherein the RTL code is a design abstraction of an Ethernet sub-circuit in an integrated circuit (IC). Still further, the non-transitory medium comprises instructions to synthesize, through the processor, a netlist from the RTL code, wherein the first stage of sequential logic is sequentially bypassed or sequentially enabled. In addition, the non-transitory medium may provide program instructions to perform, through a processor, any of the steps in the methods described above.

In still another aspect, a system comprises a processor communicatively coupled to a memory. The memory comprises a design abstraction of an Ethernet sub-circuit in an integrated circuit as a register transfer level (RTL) code. The processor is configured to implement, based on a timing parameter input to a synthesis tool associated with the RTL code, a selective bypass or a selective enablement of a first stage of sequential logic in the RTL code associated with a first stage of combinational logic in the RTL code. The processor is further configured to match a timing of the first stage of combinational logic and a second stage of combinational logic in the RTL code by the selective bypass or the selective enablement of a second stage of sequential logic in the RTL code preconfigured to time the second stage of combinatorial logic. In addition, the processor may be configured to perform any of the steps in the methods described above.

The methods and systems disclosed herein may be implemented in any means for achieving various aspects, and may be executed in a form of a non-transitory machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which:

FIGS. 3A-C are schematic diagrams of different design abstractions of a block of logic resulting from different timing parameters, according to one or more embodiments.

Other features of the present embodiments will be apparent from the accompanying drawings and from the detailed description that follows.

DETAILED DESCRIPTION

Example embodiments, as described below, may be used to provide a method, an apparatus, and/or a system of a tunable design of an Ethernet region of an integrated circuit (IC).

Figure 1:
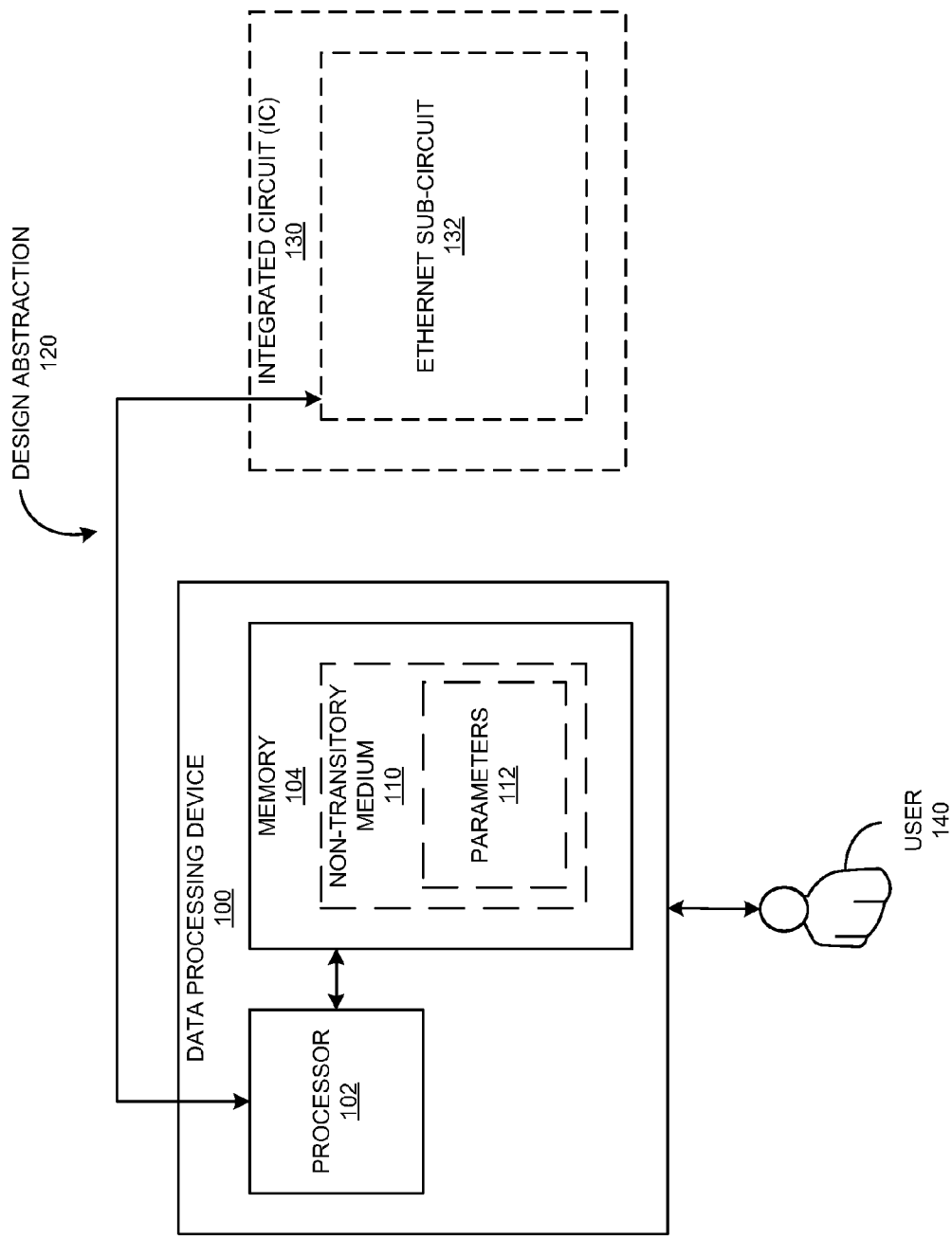
FIG. 1 is a schematic diagram of a data processing device using a non-transitory medium to generate a design abstraction of an Ethernet sub-circuit of an integrated circuit (IC), according to one or more embodiments.

FIG. 1 is a schematic diagram of a data processing device 100 using a non-transitory medium 110 to generate a design abstraction 120 of an Ethernet sub-circuit 132 of an integrated circuit (IC) 130, according to one or more embodiments. In one or more embodiments, the data processing device 100 may be any device capable of reading a register transfer level (RTL) code, executing a RTL design entry, performing a synthesis (e.g. generating a netlist from the RTL code), and/or performing a simulation of a design. Other forms of the data processing device will be appreciated by one of ordinary skill in the art and are within the scope of the exemplary embodiments discussed herein. The data processing device 100 may include a processor 102 (e.g. central processing unit (CPU), graphics processing unit (GPU)) communicatively coupled to a memory 104 (e.g. volatile memory, non-volatile memory). The memory 104 may include storage locations configured to be addressable through the processor 102.

In one or more embodiments, the non-transitory medium 110 may be stored in the memory 104. The non-transitory medium 110 may comprise an RTL code. The RTL code may be written in Verilog, SystemVerilog, VHSIC Hardware Description Language (VRTL), C++ integration with a logic simulator, and/or any other hardware description language (HDL) familiar to one of ordinary skill in the art. The RTL code may also be an RTL design entry (e.g. language statements from which hardware logic operations may be inferred). In one or more embodiments, the non-transitory medium 110 may also comprise a synthesis program (e.g. a program capable of generating a gate and/or transistor level netlist description from the RTL code). Alternatively, the synthesis program may be stored, in the memory 104 and/or another memory, separately from the non-transitory medium 110. In one or more embodiments, the non-transitory medium 110 may also comprise an application programming interface (API) associated with the RTL code. The API may be a software wrapper of the RTL code. The non-transitory medium 110 may also comprise and/or interact with other programs involved in a design of an IC and/or a design of a sub-circuit of an IC that would be familiar to one of ordinary skill in the art.

In one or more embodiments, the non-transitory medium 110 may comprise parameters 112 that determine the design of the IC and/or the design of the sub-circuit of the IC. The parameters 112 may be predetermined by a user 140 (e.g. input by the user 140 directly into the RTL code, into a synthesis tool associated with the RTL code and involved in a synthesis of a netlist from the RTL code, etc.) and/or by may be predetermined by another program associated with the API of the RTL code. In addition, the non-transitory medium 110 may determine other parameters based on the parameters 112. In one or more embodiments, another program (e.g. a simulator, the synthesis tool or another pre-processing tool) associated with the API may determine the parameters 112.

In one or more embodiments, the non-transitory medium 110 may generate a design abstraction 120 of the Ethernet sub-circuit 132 of the IC 130 and/or of the IC 130, through the processor 102. The design abstraction 120 may be the RTL code, the netlist and/or another level of design familiar to one of ordinary skill in the art. The design abstraction 120 may enable a simulation and/or a circuit level implementation of the Ethernet sub-circuit 132 and/or the IC 130. The IC 130 may be an application-specific integrated circuit (ASIC) and/or a field-programmable gate array (FPGA).

In one or more embodiments, the Ethernet region 132 may be designed to perform one or more Ethernet communications (e.g. communication over a LAN, WAN, twisted pair cable, optical fiber cable, wireless connection, etc.). Furthermore, the Ethernet region 132 may be designed to follow one or more Ethernet protocols (e.g. Institute of Electrical and Electronics Engineers (IEEE) standards, link layer discovery protocols (LLDPs), physical coding sublayer (PCS) specifications, etc.). Other Ethernet communications and protocols familiar to one of ordinary skill in the art are within the embodiments disclosed herein. The Ethernet sub-circuit 132 may also be designed to operate on open systems interconnection (OSI) layer 1, OSI layer 2, and/or OSI layer 3 (e.g. the network, data link, and/or physical layer).

In one or more embodiments, the non-transitory medium 110 may generate and/or customize the design abstraction 120 of the Ethernet sub-circuit 132 based on the parameters 112. Furthermore, the non-transitory medium 110 may bypass or enable certain logic in the design abstraction 120 based on the parameters 112. In one or more embodiments, the non-transitory medium 110 may determine other design parameters based on the parameters 112 and may generate the design abstraction 120 based on the other parameters.

In one or more embodiments, the bypassed logic may be in the form of language statements in the HDL code and/or instructions provided by the synthesis tool from which the removal of certain logic from the netlist is inferred by the synthesis program. The enabling of logic may be in the form of language statements in the HDL code and/or instructions provided by the synthesis tool from which the expansion and/or inclusion of certain logic in the netlist is inferred by the synthesis program. Specific embodiments in which the certain logic may be bypassed or enabled based on the parameters 112 will be further discussed in the description of later figures. In one or more embodiments, the design abstraction 120 of the Ethernet sub-circuit 132 may be stored, through the processor 102, in the memory 104, in another memory, and/or as a part of the non-transitory medium 110. Furthermore, the design abstraction 120 may be stored as the RTL code, another RTL code, a netlist, a circuit design, and/or a physical design.

Figure 2:
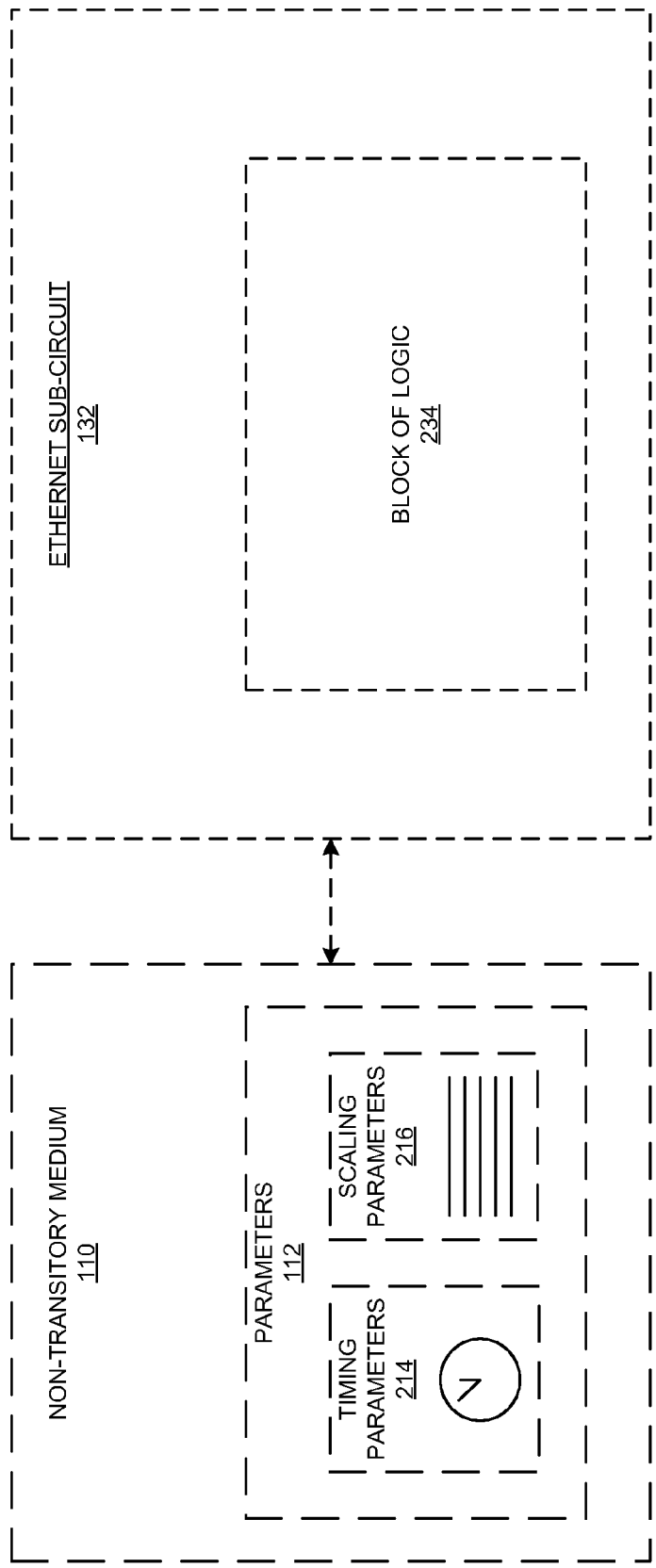
FIG. 2 is a schematic diagram of the non-transitory medium configured by timing parameters and/or scaling parameters to generate the design abstraction of the Ethernet sub-circuit containing a block of logic, according to one or more embodiments.

FIG. 2 is a schematic diagram of the non-transitory medium 110 configured by timing parameters 214 and/or scaling parameters 216 to generate the design abstraction 120 of the Ethernet sub-circuit 132 containing a block of logic 234, according to one or more embodiments. In one or more embodiments, the parameters 112 of the non-transitory medium 110 may include one or more timing parameters 214 and/or one or more scaling parameters 216. The timing parameters 214 and/or the scaling parameters 216 may be predetermined (e.g. input to the non-transitory medium 110 by a user 140 and/or by another program). In one or more embodiments, the timing parameters 214 and scaling parameters 216 may be input into an API of the non-transitory medium 110.

In one or more embodiments, the Ethernet sub-circuit 132 may comprise a block of logic 234 that can perform one or more functions (e.g. as a media access controller (MAC), a first in first out (FIFO), a physical coding sublayer (PCS), forward error correction (FEC), scrambler, encoder/decoder, etc.). Other functions of the block of logic 234 related to Ethernet communication that are familiar to one of ordinary skill in the art are within the scope of any of the embodiments disclosed herein. In one or more embodiments, the Ethernet sub-circuit 132 may comprise other blocks of logic. The timing parameters 214 and/or the scaling parameters 216 may be associated with and/or determine the design abstraction 120 of the block of logic 234 and/or the other blocks of logic.

In one or more embodiments, one or more timing parameters 214 may determine a timing of combinational logic (e.g. logic that is not clocked). The timing of combinational logic may be implemented in the design abstraction 120 by the non-transitory medium 110 as a bypassing or enabling of sequential logic (e.g. logic that is clocked) that is associated with the combinational logic. In one or more embodiments, the bypassing or enabling of sequential logic may change an amount of combinational logic to be performed by the block of logic 234 in a given clock cycle and may thereby optimize a latency of a circuit level implementation of the Ethernet sub-circuit 132.

For example, the Ethernet sub-circuit 132 may be targeted to a new technology node size that allows, for a given frequency, more or less combinational logic to be performed within a clock cycle. The user 140 may therefore determine an optimal timing of combinational logic that achieves an optimized and/or minimized latency of the Ethernet sub-circuit 132 and/or the block of logic 234 at the circuit level implementation. Furthermore, the user 140 may determine one or more timing parameters 214 that configure the non-transitory medium 110 to implement the optimal timing of logic in the design abstraction 120.

In one or more embodiments, the scaling parameters 216 may be one or more aspects of a bus (e.g. word count, word size, bus width, etc.). The bus may be a bus internal to the Ethernet sub-circuit 132, a bus coupling the Ethernet sub-circuit 132 to another sub-circuit of the IC 130, and/or a bus coupling the Ethernet sub-circuit 132 to a hardware external to the integrated circuit. The word count may be a number of words associated with the bus. The word size may be a number of bytes and/or bits in each word. The bus width may be a number of bytes and/or a number of bits associated with the bus.

In one or more embodiments, the non-transitory medium 110 may bypass or enable combinational logic and/or sequential logic, based on the scaling parameters 216, to accommodate and/or generate the bus.

In one or more embodiments, the non-transitory medium may determine aspects of the bus based on the following equation:

$$\text{Word Count} * \text{Word Size} = \text{Bus Width}$$

According to the above equation, of the three aspects of the bus (word count, word size and bus width), any one aspect of the bus can be determined by the non-transitory medium 110 based on the other two aspects of the bus. For example, if the scaling parameters 216 determine the word count of the bus to be 4 words and a word size of the bus to be 8 bytes per word, the non-transitory medium 110 may determine the bus width to be 32 bytes (i.e. 256 bits). The non-transitory medium 110 may bypass or enable combinational logic based on the bus width and/or any other aspect of the bus determined in this manner.

In one or more embodiments, the word size may be determined and/or inferred by the non-transitory medium 110 based on an internal bandwidth of the Ethernet-based communication channel. In addition, the word count and/or the bus width may be scaling parameters 216 predetermined by the user 140 such that a target bandwidth is achieved when a circuit level implementation of the Ethernet sub-circuit 132 is run at a given frequency.

In one or more embodiments, the word size may be 1, 4, 8 or more bytes based on a desired internal bandwidth of the Ethernet-based communication channel. In one or more embodiments, when the bus is external (e.g. the bus couples the Ethernet sub-circuit 132 to the another sub-circuit of the IC 130 and/or the bus couples the Ethernet sub-circuit 132 to the hardware external to the IC 130), the word count may be a power of two integer (e.g., 2, 4, 8, 16 words, etc.). Further, when the bus is internal to the Ethernet sub-circuit 132, the word count may be a power of 2 integer or a non-power of 2 integer (e.g. 1, 2, 3, 4, 5 words, etc.). Such a modularity of the scaling parameters 216 may allow for the design abstraction 120 of the Ethernet sub-circuit 132 to accommodate an external bus and/or generate an internal bus that is separate from the external bus.

In one or more embodiments, when the scaling parameter 216 is a word size, the non-transitory medium 110 may determine an identical forwarding of bytes and/or bits in a word of the size specified. The forwarding may involve extracting an header, forwarding each word to a node based on the header. In one or more embodiments, the non-transitory medium 110 may enable a configuration of the block of logic 234 to apply an identical forwarding of the number of bytes and/or bits in each word. The configuration may be additional logic inferred by a synthesis program based on an RTL code in the non-transitory medium and/or the scaling parameter 216.

In one or more embodiments, one or more timing parameters 214 and/or scaling parameter 216 may be predetermined based on the hardware environment. For example, the user 140 may wish to target the IC 130 to an original technology node size, but in a design of the another sub-circuit of the IC 130, coupled to the Ethernet sub-circuit, that will require a smaller bus width. In one or more embodiments, the user 140 may wish to bypass logic in the block of logic 234 that is unneeded to accommodate the smaller bus width. The user 140 may determine one or more scaling parameters 216 that configure the non-transitory medium 110 to implement the smaller input bus width in the design abstraction 120. The non-transitory medium 110 may bypass, based on the one or more scaling parameters 216, combinational and/or sequential logic that is unneeded to accommodate the smaller bus width. The bypassed logic may allow for a minimized and/or optimized latency, power consumption, and/or size associated with the Ethernet sub-circuit 132 when the design abstraction 120 of the Ethernet sub-circuit 132 is implemented on the circuit level.

In one example, a block of logic designed to perform a Media Access Controller (MAC) function may not need certain multiplexing combinational logic to accommodate and/or generate a smaller bus width or another scaling parameter 216. The non-transitory medium 110 may therefore bypass the unneeded multiplexing combinational logic. Furthermore, the non-transitory medium 110 may automatically bypass sequential logic associated with the multiplexing combinational logic. Additionally, the non-transitory medium 110 may bypass or enable sequential logic involved in adjusting timing and/or matching timing of certain combinational logic.

Bypassing or enabling of any logic in any function of a block of logic 234 (e.g. of a MAC, a first in first out (FIFO), a physical coding sublayer (PCS), forward error correction (FEC), scrambler, encoder/decoder, etc.) based on the scaling parameters 216 are within the scope of any of the embodiments disclosed herein.

In one or more embodiments, the non-transitory medium 110 may determine other timing parameters and/or other scaling parameters based on the timing parameters 214 and/or the scaling parameters 216. In one or more embodiments, the implementation of the timing parameters 214 and/or scaling parameters 216 in the design abstraction 120 may optimize and/or minimize the latency, a power consumption, and/or a size of the circuit level implementation of the Ethernet sub-circuit 132. In one or more embodiments, based on results of simulations of the design abstraction 120, the user 140 and/or a program may determine new parameters 112.

Figure 3B:
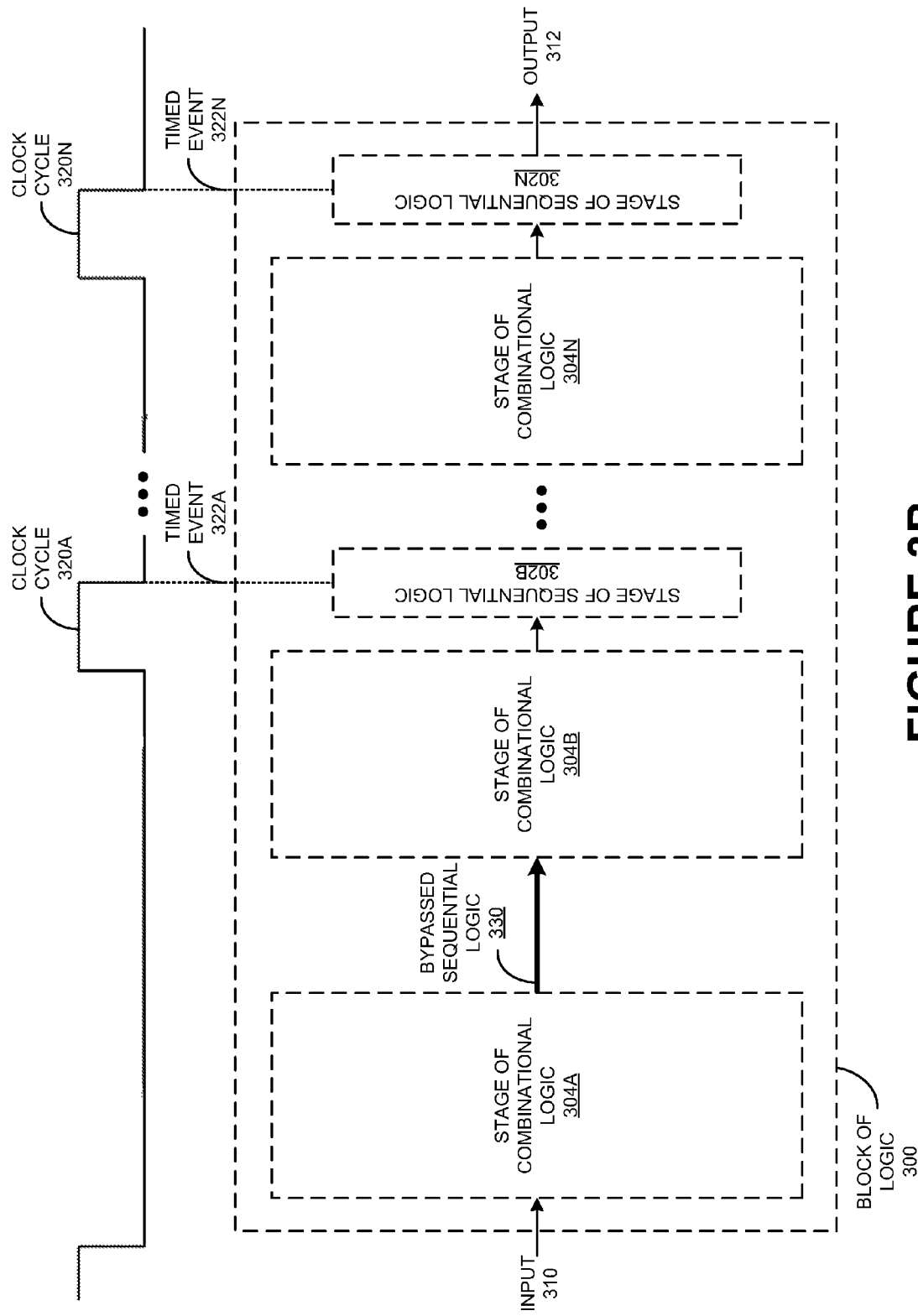

FIGS. 3A-C are schematic diagrams of different design abstractions 120 of a block of logic 300 resulting from different timing parameters 214, according to one or more embodiments. In one or more embodiments, the block of logic 300 may further comprise one or more stages of sequential logic 302A-N. The stages of sequential logic 302A-N may be any logic that is clocked (e.g. that is synchronized with a clock), and may comprise one or more flip-flops and/or latches (e.g. a set-reset (SR) latch, delay (D) latch, toggle (T) latch, JK latch, set-reset (SR) flip-flop, delay (D) flip-flop, toggle (T) flip-flop, etc.)).

In one or more embodiments, the block of logic 300 may consist of one or more stages of combinational logic 304A-N. The stages of combinational logic 304A-N may be any logic that is not clocked. Furthermore, the stages of combinational logic 304A-N in the block of logic 300 may associated with any of the functions (e.g. as a media access controller (MAC), a first in first out (FIFO), a physical coding sublayer (PCS), cycle redundancy check (CRC) on one or more levels, scrambler, encoder/decoder, other integrity checks, serializer/deserializer (SerDes), etc.) performed by the block of logic 300.

In one or more embodiments, the stages of sequential logic 302A-N may determine the timing of the stages of combinational logic 304A-N. Furthermore, one or more stages of sequential logic 302A-N may be bypassed or enabled based on one or more timing parameters 214.

In one or more embodiments, a circuit level implementation of the block of logic 300 may be timed by clock cycles 320A-N. The rising and/or falling edges of the clock cycles 320A-N (e.g. timed events 322A-N) may be used to time each stage of sequential logic 302A-N. Each stage of sequential logic 302A-N may therefore determine the timing of one or more associated stages of combinational logic 304A-N.

In one or more embodiments, in the circuit level implementation, when a data packet (e.g. all or part of a: frame, word, byte, etc.) from an input 310 to the block of logic 300 is processed by the stage of combinational logic 304A during the clock cycle 320A, the processed data packet may be an output 312 from the block of logic 300 after the clock cycle 320N (e.g. upon the timed event 322N). The bypassing or enabling of one or more stages of sequential logic 302A-N may determine a timing of the stages of combinational logic 304A-N. In one or more embodiments, the timing of each stage of combinational logic 304A-N may be the clock cycle 320A-N at which the stage of combinational logic 304A-N will process the data packet in the circuit level implementation.

For example, in FIG. 3B, the IC associated with the Ethernet sub-circuit 132 may be targeted to a faster switching technology. The non-transitory medium 110 may bypass the stage of sequential logic 302A in the design abstraction 120, based on one or more timing parameters 214. The bypassed sequential logic 330 in the design abstraction 120 may allow for both stages of combinational logic 304A-B to be timed in the same cycle (e.g. process the data packet in the clock cycle 320A, in the circuit level implementation). A latency may thereby be reduced (e.g. the number of clock cycles 320A-N required for the block of logic 300 to process the data packet, for a given frequency, in the circuit level implementation may be reduced). One of ordinary skill in the art will appreciate that any of the stages of sequential logic 302A-N may be bypassed or enabled in this manner to determine the timing of the stages of combinational logic 304A-N in any of the embodiments disclosed herein.

In one or more embodiments, the non-transitory medium 110 may be configured to automatically bypass or enable sequential logic to match the timing of two or more stages of combinational logic that are in parallel and need to be timed together (e.g. need to operate in the same clock cycle 320A-N). For example, in FIG. 3C, an input 310C and an output 312C may be associated with the stages of combinational logic 304A-N and/or with parallel stages of combinational logic 344A-N that are coupled to one or more stages of combinational logic 304A-N. In addition, one or more stages of combinational logic 304A-N may need to be timed with one or more parallel stages of combinational logic 344A-N. If the stage of combinational logic 304B is timed to the clock cycle 320A and needs to match the timing of the parallel stage of combinational logic 344B, the non-transitory medium 110 may automatically bypass sequential logic to time the parallel stage of combinational logic 344B to the clock cycle 320A. The bypassed sequential logic 360 may allow the stage of combinational logic 304B and the parallel stage of combinational logic 344B to be timed to the same clock cycle (e.g. clock cycle 320A). The bypassed sequential logic 360 also may allow a stage of sequential logic 342B (of stages of sequential logic 342B-N) to be timed by the timed event 322A.

In one or more embodiments, one or more stages of combinational logic in parallel to one another may or may not be directly coupled to one another. Further, the stages of combinational logic in parallel to one another may or may not need to be timed together. In one or more embodiments, the non-transitory medium 110 may be configured to automatically match the timing of certain stages of combinational logic that are parallel to one another. Which stages of combinational logic should match timing may be specified by an RTL code in the non-transitory medium 110 and/or by a synthesis tool in the non-transitory medium 110. For example, a stage of combinational logic in a control plane may need to be timed together with a parallel stage of combinational logic in a data plane.

Figure 4A:
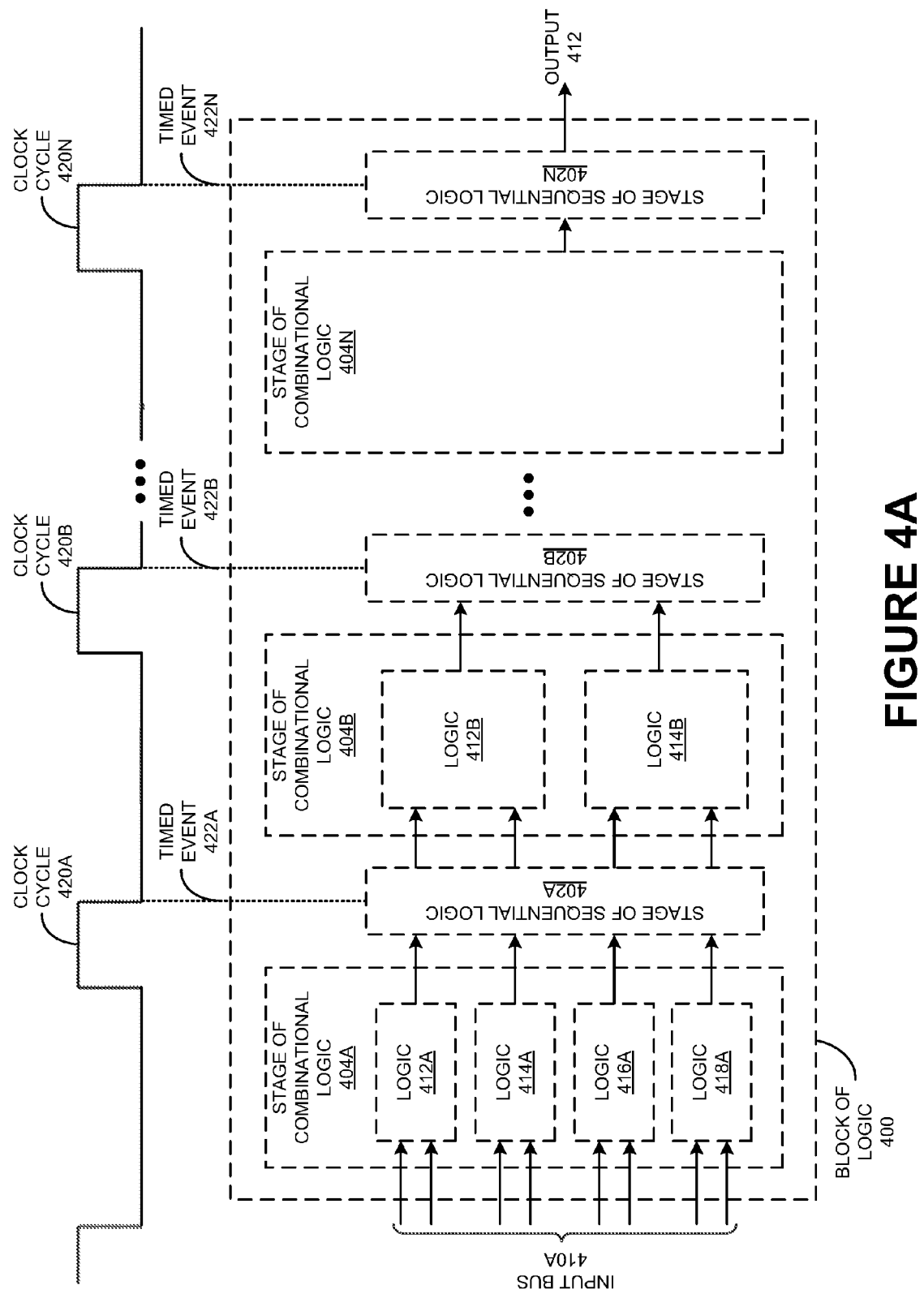
FIGS. 4A-B are schematic diagrams of different design abstractions of a block of logic resulting from different scaling parameters, according to one or more embodiments.
Figure 4B:
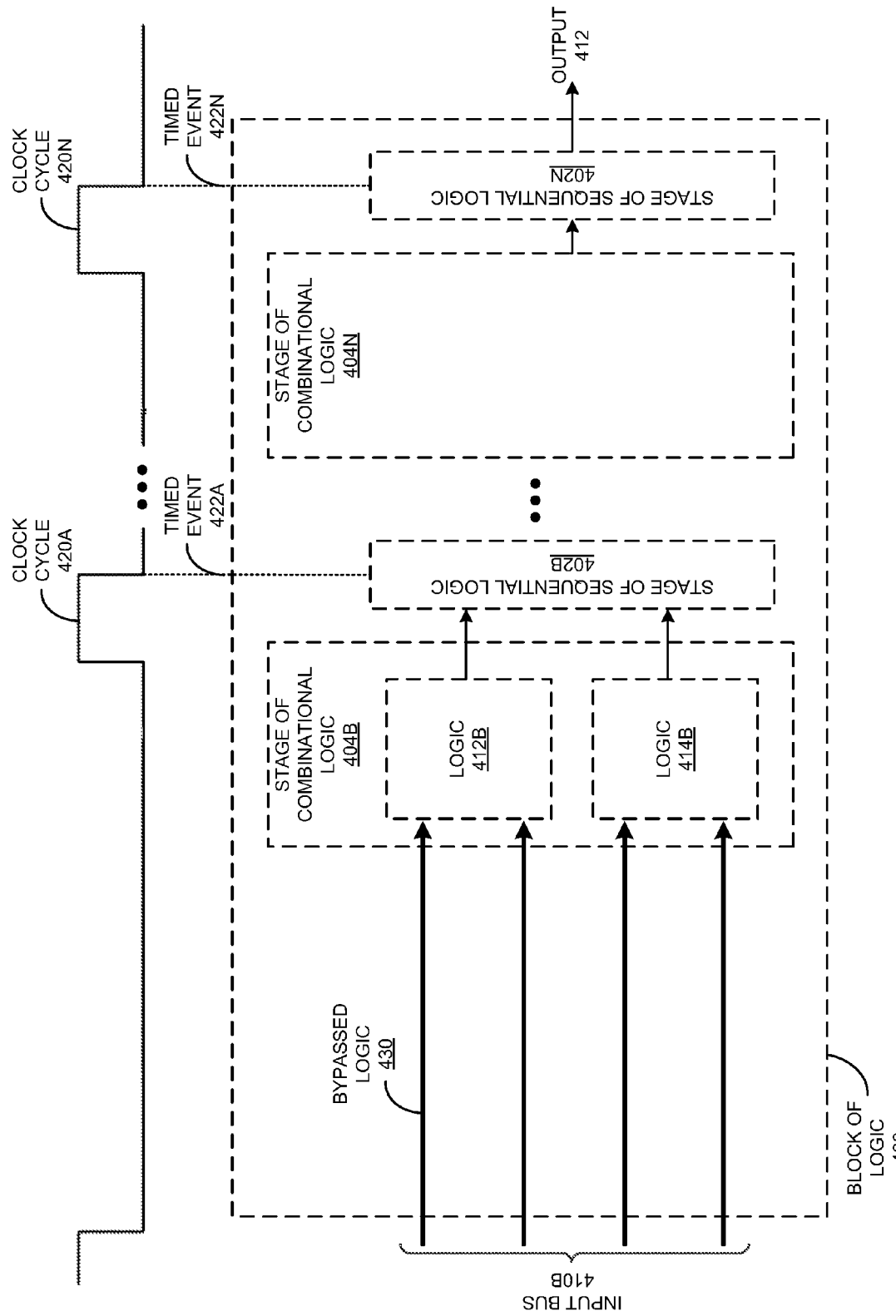

FIGS. 4A-B are schematic diagrams of different design abstractions 120 of a block of logic 400 resulting from different scaling parameters 216, according to one or more embodiments. In one or more embodiments, one or more scaling parameters 216 may be a word count, a word size, and/or a total width of a bus to be input to and/or output from the block of logic 400.

In one or more embodiments, stages of sequential logic 402A-N in the block of logic 400 may be associated with stages of combinational logic 404A-N in the block of logic 400. Furthermore, the stages of sequential logic 402A-N may be timed by the rising and/or falling edges of clock cycles 420A-N (e.g. timed events 422A-N).

In one or more embodiments, the stages of combinational logic 404A-N may be involved in any of the functions performed by the block of logic 400 (e.g. of a media access controller (MAC), a first in first out (FIFO), a physical coding sublayer (PCS), forward error correction (FEC), scrambler, encoder/decoder, etc.). Furthermore, the stages of combinational logic 404A-N may be predesigned and/or preidentified to only be necessary to accommodate and/or generate certain busses (e.g. busses with certain word counts, certain word sizes, certain bus widths, etc.). In one or more embodiments, the non-transitory medium 110 may, based on the scaling parameters 216, bypass one or more stages of combinational logic 404A-N that are unneeded to accommodate and/or generate the bus. The non-transitory medium 110 may further, based on the scaling parameters 216, enable one or more stages of combinational logic 404A-N that are needed to accommodate and/or generate the bus.

In one or more embodiments, the non-transitory medium 110 may automatically bypass or enable one or more stages of sequential logic 402A-N involved in timing the one or more bypassed or enabled stages of combinational logic 404A-N. The non-transitory medium 110 may additionally automatically bypass or enable sequential logic to match a timing of one or more of the stages of combinational logic 404A-N with one or more parallel stages of combinational logic.

In one or more embodiments, the user 140 and/or another program may determine one or more timing parameters 214 to configure the non-transitory medium 110 to bypass or enable one or more stages of sequential logic 402A-N involved in timing the bypassed or enabled stages of combinational logic 404A-N.

In one or more embodiments of FIG. 4A, the scaling parameters 216 may be an input bus 410A (e.g. word count, word size, total width of the input bus) to be input to the block of logic 400. In addition, the scaling parameters 216 may be a number of lanes and/or a size of each lane of the input bus 410A. In an example of FIG. 4B, the input bus 410B may have a smaller bus width than the input bus 410A does. The stage of combinational logic 404A may not be necessary to accommodate the bus width of the input bus 410B. Based on one or more of the scaling parameters 216 that describes the bus width of the input bus 410B, the non-transitory medium 110 may bypass the stage of combinational logic 404A. Additionally, if a stage of sequential logic 402A is associated with the stage of combinational logic 404A (e.g. is designed to hold an output to and/or an input from the stage of combinational logic 404A), then the stage of sequential logic 402A may be bypassed (e.g. automatically by the non-transitory medium 110 and/or based on one or more predetermined timing parameters 214). The result may be a decrease in an amount of transistors in the circuit level implementation of the block of logic 400 that may allow for an optimized latency, power consumption, and/or size associated with a circuit level implementation of the block of logic 400.

Figure 5:
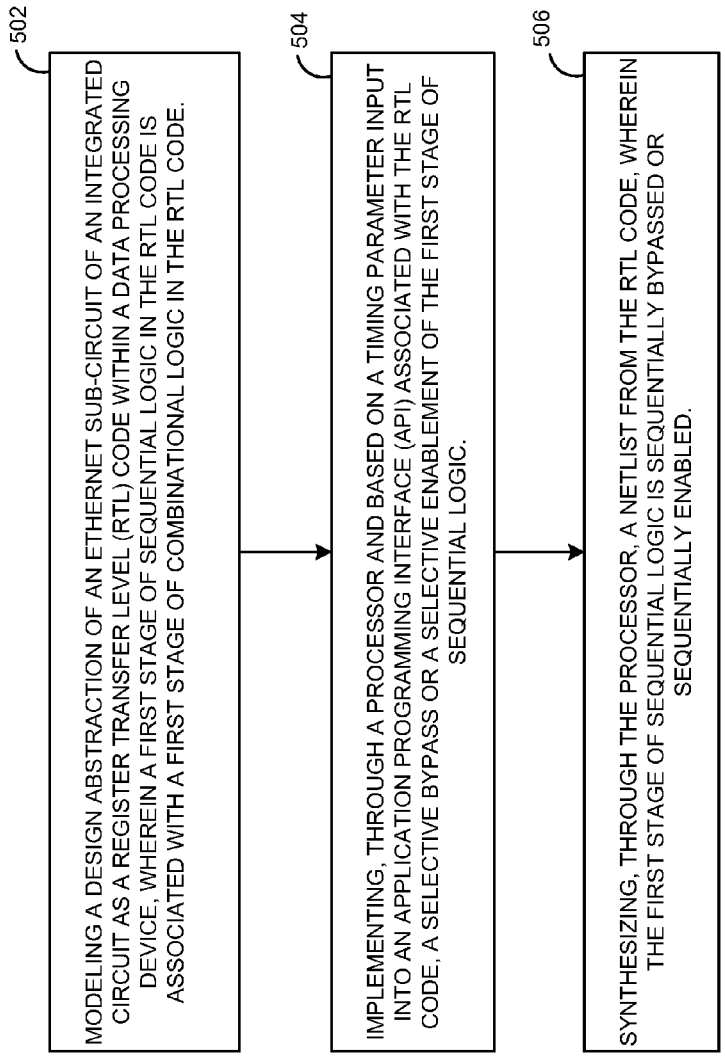
FIG. 5 is a process flow diagram illustrating a method of a tunable design of an Ethernet sub-circuit of an integrated circuit (IC), according to one or more embodiments.

FIG. 5 is a process flow diagram illustrating a method of a tunable design of an Ethernet sub-circuit of an integrated circuit (IC), according to one or more embodiments. In one or more embodiments, operation 502 involves modeling a design abstraction of an Ethernet sub-circuit of an integrated circuit as a register transfer level (RTL) code within a data processing device, wherein a first stage of sequential logic in the RTL code is associated with a first stage of combinational logic in the RTL code. In one or more embodiments, operation 504 involves implementing, through a processor and based on a timing parameter input into a synthesis tool associated with the RTL code, a selective bypass or a selective enablement of the first stage of sequential logic. In one or more embodiments, operation 506 involves synthesizing, through the processor, a netlist from the RTL code, wherein the first stage of sequential logic is sequentially bypassed or sequentially enabled.

Figure 6:
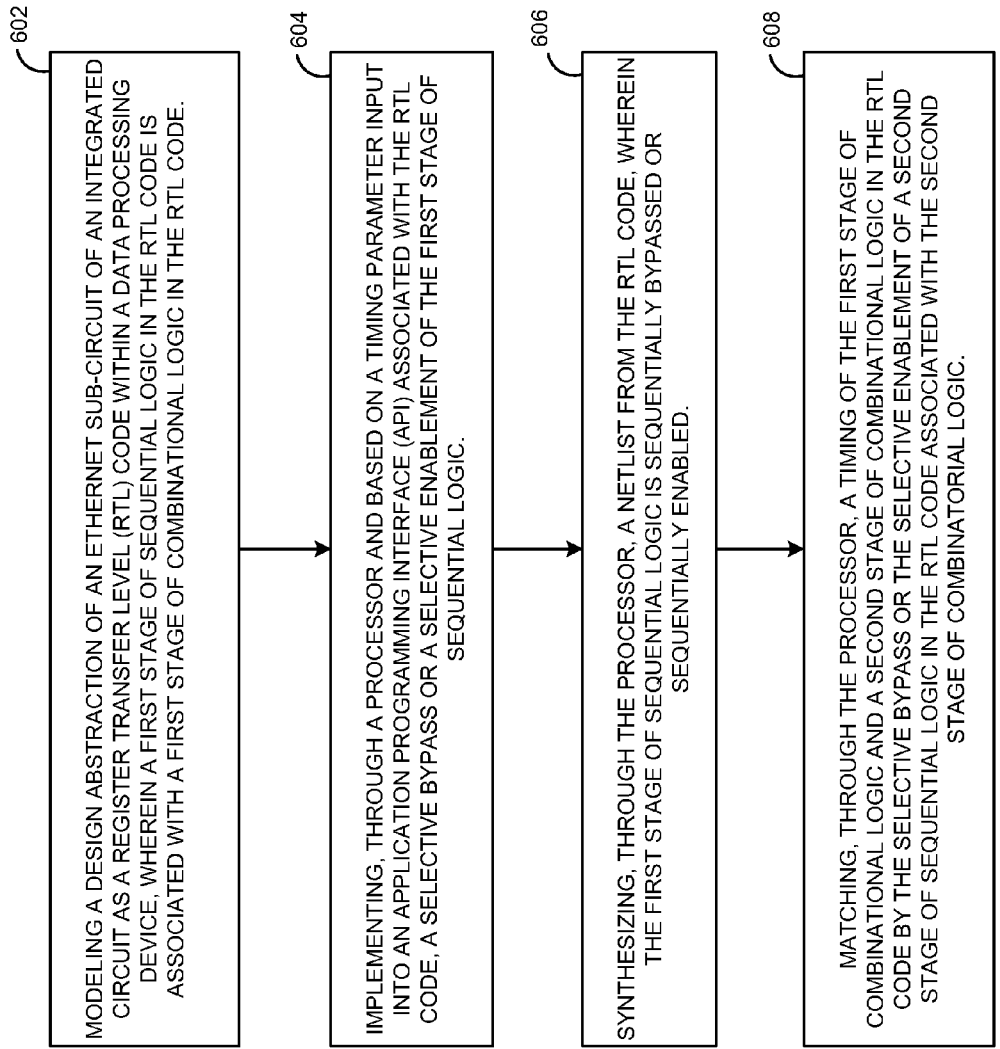
FIG. 6 is a process flow diagram illustrating a method of a tunable design of an Ethernet sub-circuit of an IC that involves an automatic matching of timing of logic, according to one or more embodiments.

FIG. 6 is a process flow diagram illustrating a method of a tunable design of an Ethernet sub-circuit of an integrated circuit (IC) that involves a matching of timing of combinational logic, according to one or more embodiments. In one or more embodiments, operation 602 involves modeling a design abstraction of an Ethernet sub-circuit of an integrated circuit as a register transfer level (RTL) code within a data processing device, wherein a first stage of sequential logic in the RTL code is associated with a first stage of combinational logic in the RTL code. In one or more embodiments, operation 604 involves implementing, through a processor and based on a timing parameter input into a synthesis tool associated with the RTL code, a selective bypass or a selective enablement of the first stage of sequential logic. In one or more embodiments, operation 606 involves synthesizing, through the processor, a netlist from the RTL code, wherein the first stage of sequential logic is sequentially bypassed or sequentially enabled. In one or more embodiments, operation 608 involves matching, through the processor, a timing of the first stage of combinational logic and a second stage of combinational logic in the RTL code by the selective bypass or the selective enablement of a second stage of sequential logic in the RTL code associated with the second stage of combinatorial logic.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other operations may be provided, or operations may be eliminated, from the described flows, and other components may be added to, or removed from, the described systems. Accordingly, other embodiments are within the scope of the following claims.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A method, comprising:
    modeling a design abstraction of an Ethernet sub-circuit of an integrated circuit as a register transfer level (RTL) code within a data processing device, wherein a first stage of sequential logic in the RTL code is associated with a first stage of combinational logic in the RTL code;
    implementing, through a processor and based on a timing parameter input into a synthesis tool associated with the RTL code, a selective bypass or a selective enablement of the first stage of sequential logic; and
    synthesizing, through the processor, a netlist from the RTL code, wherein the first stage of sequential logic is sequentially bypassed or sequentially enabled.

2. The method of claim 1, further comprising:
    matching, through the processor, a timing of the first stage of combinational logic and a second stage of combinational logic in the RTL code by the selective bypass or the selective enablement of a second stage of sequential logic in the RTL code associated with the second stage of combinatorial logic.

3. The method of claim 1, further comprising:
    implementing, through the processor and based on a scaling parameter input into the synthesis tool associated with the RTL code, the selective bypass or the selective enablement of at least one of a third stage of sequential logic in the RTL code and a third stage of combinational logic in the RTL code;
    wherein the scaling parameter, which is predetermined, is at least one of a width of a bus, a word count of the bus, and a word size of the bus; and
    Wherein the bus is at least one of a bus internal to the Ethernet sub-circuit, a bus coupling the Ethernet sub-circuit to the integrated circuit, and a bus coupling the Ethernet sub-circuit to a hardware external to the integrated circuit.

4. The method of claim 3, further comprising:
    determining, through the processor, one of the word count, the word size, and the width of the bus based on the other two of the word count, the word size, and the width of the bus; and
    defining, through the processor, the scaling parameter to be the one of the word count, the word size, and the width of the bus.

5. The method of claim 3, wherein when the scaling parameter is the word size of the bus, the Ethernet sub-circuit is configured, through the processor, to apply an identical forwarding of at least one of each byte in a word and each bit in the word.

6. The method of claim 3, further comprising:
    optimizing, through the processor, a latency of the Ethernet sub-circuit processing a data flow when the selective bypass of a stage of sequential logic allows for more combinational logic to be performed in a clock cycle;
    optimizing, through the processor, a power consumption of the Ethernet sub-circuit processing the data flow when a stage of combinational logic is selectively bypassed; and
    optimizing, through the processor, a physical size of the Ethernet sub-circuit when the stage of combinational logic is selectively bypassed.

7. The method of claim 1, wherein at least one of the timing parameter and a scaling parameter is determined by a program associated with an application programming interface (API) of the RTL code.

8. A non-transitory medium, readable through a processor and including instructions embodied therein that are executable through the processor, comprising:
    instructions to implement, through the processor and based on a timing parameter input into a synthesis tool associated with a register transfer level (RTL) code, a selective bypass or a selective enablement of a first stage of sequential logic in the RTL code associated with a first stage of combinational logic in the RTL code, wherein the RTL code is a design abstraction of an Ethernet sub-circuit in an integrated circuit (IC); and
    instructions to synthesize, through the processor, a netlist from the RTL code, wherein the first stage of sequential logic is sequentially bypassed or sequentially enabled.

9. The non-transitory medium of claim 8, further comprising:
    instructions to match, through the processor, a timing of the first stage of combinational logic and a second stage of combinational logic in the RTL code by the selective bypass or the selective enablement of a second stage of sequential logic in the RTL code preconfigured to time the second stage of combinatorial logic.

10. The non-transitory medium of claim 8, further comprising:
    instructions to implement, through the processor and based on a scaling parameter input into the synthesis tool associated with the RTL code, the selective bypass or the selective enablement of at least one of a third stage of sequential logic in the RTL code and a third stage of combinational logic in the RTL code;
    wherein the scaling parameter, which is predetermined, is at least one of a width of a bus, a word count of the bus, a word size of the bus, a number of lanes in the bus, and a width of the lanes in the bus; and
    wherein the bus is at least one of a bus internal to the Ethernet sub-circuit, a bus coupling the Ethernet sub-circuit to the integrated circuit, and a bus coupling the Ethernet sub-circuit to a hardware external to the integrated circuit.

11. The non-transitory medium of claim 10, further comprising:
    instructions to determine, through the processor, one of the word count, the word size, and the width of the bus based on the other two of the word count, the word size, and the width of the bus; and instructions to define, through the processor, the scaling parameter to be the one of the word count, the word size, and the width of the bus.

12. The non-transitory medium of claim 10, wherein when the scaling parameter is the word size of the bus, the Ethernet sub-circuit is configured, through the processor, to apply an identical forwarding of at least one of each byte in a word and each bit in the word.

13. The non-transitory medium of claim 10, further comprising:
instructions to optimize, through the processor, a latency of the Ethernet sub-circuit processing a data flow when the selective bypass of a stage of sequential logic allows for more combinational logic to be performed in a clock cycle;
instructions to optimize, through the processor, a power consumption of the Ethernet sub-circuit processing the data flow when a stage of combinational logic is selectively bypassed; and
instructions to optimize, through the processor, a physical size of the Ethernet sub-circuit when the stage of combinational logic is selectively bypassed.

14. The non-transitory medium of claim 8, wherein at least one of the timing parameter and a scaling parameter is determined by a program associated with an application programming interface (API) of the RTL code.

15. A system, comprising:
a processor communicatively coupled to a memory;
the memory comprising a design abstraction of an Ethernet sub-circuit in an integrated circuit as a register transfer level (RTL) code;
wherein the processor is configured to:
implement, based on a timing parameter input to a synthesis tool associated with the RTL code, a selective bypass or a selective enablement of a first stage of sequential logic in the RTL code associated with a first stage of combinational logic in the RTL code; and
match a timing of the first stage of combinational logic and a second stage of combinational logic in the RTL code by the selective bypass or the selective enablement of a second stage of sequential logic in the RTL code preconfigured to time the second stage of combinatorial logic.

16. The system of claim 15, wherein the processor is further configured to:
implement, based on a scaling parameter input into the synthesis tool associated with the RTL code, the selective bypass or the selective enablement of at least one of a third stage of sequential logic in the RTL code and a third stage of combinational logic in the RTL code;
wherein the scaling parameter, which is predetermined, is at least one of a width of a bus, a word count of the bus, a word size of the bus, a number of lanes in the bus, and a width of the lanes in the bus; and
wherein the bus is at least one of a bus internal to the Ethernet sub-circuit, a bus coupling the Ethernet sub-circuit to the integrated circuit, and a bus coupling the Ethernet sub-circuit to a hardware external to the integrated circuit.

17. The system of claim 16, wherein the processor is further configured to:
determine one of the word count, the word size, and the width of the bus based on the other two of the word count, the word size, and the width of the bus; and
determine the scaling parameter to be the one of the word count, the word size, and the width of the bus.

18. The system of claim 16, wherein when the scaling parameter is the word size of the bus, the Ethernet sub-circuit is configured, through the processor, to apply an identical forwarding of at least one of each byte in a word and each bit in the word.

19. The system of claim 16, wherein the processor is further configured to:
optimize a latency of the Ethernet sub-circuit processing a data flow when the selective bypass of a stage of sequential logic allows for more combinational logic to be performed in a clock cycle;
optimize a power consumption of the Ethernet sub-circuit processing the data flow when a stage of combinational logic is selectively bypassed; and
instructions to optimize a physical size of the Ethernet sub-circuit when the stage of combinational logic is selectively bypassed.

20. The system of claim 15, wherein at least one of the timing parameter and a scaling parameter is determined by a program associated with an application programming interface (API) of the RTL code.

* * * * *